(12) United States Patent
Simpson

(10) Patent No.: US 10,777,494 B2
(45) Date of Patent: Sep. 15, 2020

(54) SEMICONDUCTOR DEVICE SUB-ASSEMBLY

(71) Applicants: Dynex Semiconductor Limited, Lincolnshire (GB); Zhuzhou CRRC Times Electric Co. Ltd., Hunan (CN)

(72) Inventor: Robin Adam Simpson, Lincolnshire (GB)

(73) Assignees: DYNEX SEMICONDUCTOR LIMITED (GB); ZHUZHOU CRRC TIMES ELECTRONIC CO. LTD. (CN)

(*) Notice: Subject to any disclaimer, the term of this patent is extended or adjusted under 35 U.S.C. 154(b) by 0 days.

(21) Appl. No.: 16/311,833

(22) PCT Filed: Jan. 23, 2017

(86) PCT No.: PCT/GB2017/050169
§ 371 (c)(1),
(2) Date: Dec. 20, 2018

(87) PCT Pub. No.: WO2017/220955
PCT Pub. Date: Dec. 28, 2017

(65) Prior Publication Data
US 2019/0259693 A1 Aug. 22, 2019

Related U.S. Application Data

(60) Provisional application No. PCT/GB2016/051842, filed on Jun. 20, 2016.

(51) Int. Cl.
*H01L 23/498* (2006.01)
*H01L 23/00* (2006.01)
*H01L 25/11* (2006.01)

(52) U.S. Cl.
CPC .. *H01L 23/49811* (2013.01); *H01L 23/49844* (2013.01); *H01L 24/72* (2013.01);
(Continued)

(58) Field of Classification Search
CPC ........ H01L 23/49811; H01L 23/49844; H01L 24/72; H01L 24/90; H01L 24/97;
(Continued)

(56) References Cited

U.S. PATENT DOCUMENTS 4,224,663 A 9/1980 Maiese et al.
4,918,514 A * 4/1990 Matsuda ............... H01L 23/051
257/179

(Continued)

FOREIGN PATENT DOCUMENTS

CN 103579165 A 2/2014
JP 2004158489 A 6/2004

OTHER PUBLICATIONS

Makan Chen et al., ABB High power semiconductors for T&D and industry application: StakPak & IGCT introduction, Nov. 10, 2014.
(Continued)

*Primary Examiner* — Tong-Ho Kim
(74) *Attorney, Agent, or Firm* — Tarolli, Sundheim, Covell & Tummino LLP

(57) ABSTRACT

We disclose herein a semiconductor device sub-assembly comprising: a plurality of semiconductor units laterally spaced to one another; a plurality of conductive blocks, wherein each conductive block is operatively coupled with each semiconductor unit; a conductive malleable layer operatively coupled with each conductive block, wherein the plurality of conductive blocks are located between the conductive malleable layer and the plurality of semiconductor units. In use, at least some of the plurality of conductive blocks are configured to apply a pressure on the conductive malleable layer, when a predetermined pressure is applied to the semiconductor device sub-assembly.

21 Claims, 11 Drawing Sheets

(52) U.S. Cl.
CPC .............. *H01L 24/90* (2013.01); *H01L 24/97* (2013.01); *H01L 25/115* (2013.01); *H01L 2924/1203* (2013.01); *H01L 2924/1305* (2013.01); *H01L 2924/13055* (2013.01); *H01L 2924/13091* (2013.01)

(58) Field of Classification Search
CPC ........... H01L 25/115; H01L 2924/1203; H01L 2924/1305; H01L 2924/13055; H01L 2924/13091
USPC ........................................................ 257/737
See application file for complete search history.

(56) References Cited

U.S. PATENT DOCUMENTS

| | | | |
|---|---|---|---|
| 5,828,564 | A | 10/1998 | Mori et al. |
| 5,874,774 | A | 2/1999 | Takahashi |
| 5,990,501 | A * | 11/1999 | Hiyoshi ................ H01L 23/051 257/181 |
| 5,994,773 | A | 11/1999 | Hirakawa |
| 2011/0266665 | A1 * | 11/2011 | Gowda ................ H01L 25/071 257/691 |
| 2015/0053350 | A1 * | 2/2015 | Han ........................ H01L 24/81 156/381 |
| 2015/0102383 | A1 * | 4/2015 | Golland .............. H01L 23/3736 257/140 |

OTHER PUBLICATIONS

ABB StakPak: IGBT press-pack modules, 2015.
IXYS UK Westcode Application note for device mounting instructions, Feb. 13, 2015.
Tinschert et al., Possible failure modes in Press-Pack IGBTs, Feb. 19, 2015.
Frank, Power Cycle Testing of Press-Pack IGBT Chips, Jun. 2014.
International Search Report and Written Opinion for corresponding international application No. PCT/GB2017/050169, dated Mar. 20, 2017.

* cited by examiner

SEMICONDUCTOR DEVICE SUB-ASSEMBLY

RELATED APPLICATIONS

The present invention is a U.S. National Stage under 35 USC 371 patent application, claiming priority to Serial No. PCT/GB2017/050169, filed on 23 Jan. 2017, which claims priority to PCT/GB2016/051842, filed on 20 Jun. 2016, the entirety of each of which is incorporated herein by reference.

FIELD OF INVENTION

The present invention relates to a semiconductor device sub-assembly.

BACKGROUND OF THE INVENTION

It is advantageous for a multiple chip device to have the following features:
  The pressure distribution across each chip and between chips is uniform;
  The applied pressure should be within a defined operating range.

In traditional designs, semiconductor chips are placed between mechanical strain buffers, such as molybdenum or tungsten, to form a semiconductor unit. These semiconductor units are then placed between two common copper electrodes (see FIG. 6 for an illustration of this). For improved performance, in terms of current handling capability and reliability, the pressure distribution across the chips within the package should be as uniform as possible. This is difficult to achieve, as micron-level differences in semiconductor unit thickness or surface flatness variations across the copper electrodes can lead to applied pressures that differ greatly between semiconductor chips and also differ from the intended target pressure. The flatness and parallelism of components, such as heatsinks in the end-users' application will also have a significant effect on this. The effect is amplified in cases where multiple devices are clamped in a single stack for series operation, due to the additive effect of all of the tolerances within the stack. The inventor has appreciated that there are applications where up to twenty such devices are clamped in a single stack (see prior art 1 below).

It is known that the performance of semiconductor chips is affected by the level of applied pressure in pressure-contact applications, such that under- or over-pressurisation can result in sub-optimal performance and poor reliability. In addition to this, the pressure that can be applied to the chips within the traditional design is not limited in any way, so they are vulnerable to both under- and over-pressurisation by the end-user.

One approach (shown in prior art 2 below and also see FIG. 6) is to use extremely tightly toleranced components (typically matched to within 1 μm), to ensure component thicknesses are as closely matched as possible and to dictate that end-users provide clamp components (such as heatsinks and load spreaders) that have a much tighter flatness tolerance for multi-chip pressure contact devices than is used for traditional single chip pressure contact devices, such as large-area thyristors (e.g. typically 10 μm flatness tolerance, instead of 30 μm) (see prior art 3). Tight component tolerance ranges become hard to manage with large numbers of components, as is the case in large-area multi-chip pressure contact devices. Tight flatness tolerances for clamping components also become harder to achieve across a large surface area, compounding the problem.

Another approach is to use individual disc spring stacks in line with each individual semiconductor unit within the housing in order to reduce the force/displacement ratio. In this way, for a given difference in semiconductor unit thicknesses or a given flatness variation, the difference in contact pressure is minimised. As the disc springs are relatively poor electrical conductors, conductive metallic bypass strips (longitudinal current bypass) or stamped, contoured metal sheets (lateral current bypass) are used. Bypass strips run from the top to the bottom of the stack of disc springs. When the disc springs are compressed, the flexible bypass strip bows outwards. This arrangement is used in ABB's StakPak arrangement which is shown in FIG. 1. Due to the outward bow of the bypass strips, the packing density of chips may be limited, in turn limiting the current density of the finished device.

The stamped, contoured metal sheet is shaped as shown in FIG. 2 and incorporated in the finished device described in patent number CN103579165 (prior art 4). As with the longitudinal current bypass strip method in FIG. 1, due to the shaping of the sheet, and the area required to form the sheet, the packing density of chips is limited, again limiting the current density of the finished device.

A further approach is to use a pressurised fluid to pressurise the contact components in the device. This has been detailed in patent JP2004158489 (prior art 5). This does, however, rely on the availability of pressurised fluid, which is feasible in hybrid vehicles, but less so in typical industrial and transmission and distribution applications.

Two approaches for applying correct applied pressure are known. Both apply only to the design using disc springs described above.

The first approach (as used in ABB's StakPak) uses the rigid insulative sleeve of the device housing as a travel-stop mechanism, which prevents depression of the external contact surfaces beyond a defined plane (prior art 2). The chips are grouped into sub-modules which contain the spring assemblies. Either four or six sub-modules are used in a finished device, each of which is individually tested before being assembled. The device specification requires the load to be sufficient to compress the external contact surfaces level with the top of the sleeve (referred to as the threshold load in this document). Beyond the threshold load, any excess load is supported by the sleeve and the load applied to the chips is then dictated by the load/displacement ratio of the spring system and increases no further, even with extra loading. The displacement is defined as the difference between the pre-load height of the spring stack and the loaded height of the spring stack, once the sleeve begins to carry the mechanical load. In this design, only the sleeve supports load above the threshold load around the perimeter of the device, with no mechanical support provided in the centre of the device.

The second approach described in CN103579165 (prior art 4) uses a rigid insulative support frame inside the device housing to act as a travel stop mechanism. This acts in a similar manner to the perimeter travel stop mechanism described above. From the images given, it appears that load above the threshold load is supported in the centre of the device as well as at the edge. For this design to be tested or operated, the entire device must be fully assembled. Operation as a subassembly is not possible.

Investigations of pressure distribution using tightly toleranced components in a 125 mm press-pack package have found pressure uniformity to be very poor. Similar trials involving a 125 mm package may have also been found to have poor pressure distribution. Such difficulties achieving uniform clamping indicate that performance of the device as a whole is likely to be far from optimum. It has also been found that pressure distribution is greatly affected by the flatness of the clamping components that apply the mechanical load to the external pole faces of the device. Poor pressure distribution may have been seen even when using clamping components that were lapped flat and had measured flatness of around 5 µm across their entire device contact area, which is far flatter than called for in IXYS UK Westcode's application note in a press with adaptive heads, specially-designed to ensure parallelism between the upper and lower clamping surfaces.

Trends in patent activity over the past 25 years show a migration from rigid solutions for multi-chip pressure contact devices to solutions with enhanced compliance. These solutions include sprung solutions (ABB, Toshiba, Infineon, State Grid Corporation China) and solutions where the uniform pressure is provided by a pressurized fluid (Honda).

The only rigid solutions for which significant information has been found are those of IXYS UK Westcode, Toshiba and Fuji Electric. The Fuji Electric devices may not appear to be manufactured any longer. Little information can be found on the Toshiba devices, although they may be still advertised and sold. Recent published literature from IXYS UK Westcode large-area press-pack IGBT devices indicates that they may have reliability issues, which are suspected to result from pressure distribution problems (see prior art 6 and 7). These papers show that with a ΔTj of 78° C. the cycles to failure for an IXYS UK Westcode multi-chip pressure contact device is approximately 6,000 cycles for multi-chip pressure contact devices of rigid construction. This may compare unfavourably with single chip pressure contact devices, for which at a ΔTj of 80° C. the cycles to failure is far in excess of 100,000 cycles. Other published literature reviews have found by simulation that pressure uniformity may be grossly affected by micron-level differences in components in each chip's component stack.

Published literature is available on ABB's sprung solution, the StakPak, including case studies of HVDC Light schemes around the world using as many as 6,000 StakPak devices per scheme. One ABB presentation identifies 10 such schemes (prior art 1). According to ABB's own literature, their sprung solution has proven to be generally reliable in HVDC Light schemes. This published literature even provides details of failure rates, which appear to be relatively low.

It is desirable that to create high reliability multi-chip packages, a more compliant solution than that offered by the rigid copper electrodes is required.

A mechanical prototype of the design has been produced. As its design intended, the pressure uniformity was changed relative to that achieved with the traditional design device.

In addition to the background description above, we also summarise the general prior art as follows:
Prior Art 1—ABB (2014) High power semiconductors for T&D and industry application: StakPak & IGCT Introduction
  Slide 18 shows 20 devices in one series stack.
  Slide 19 states that by 2012 there were 10 HVDC Light projects using the ABB IGBT StakPak.
Prior Art 2—ABB (2015) StakPak: IGBT press-pack modules
  Page 3 shows operation of ABB StakPak with loading stops.
Prior Art 3—IXYS UK Westcode (2015) Application note for device mounting instructions
  Surface flatness instructions indicate a flatness tolerance of 10 µm for multi-chip pressure contact devices as opposed to 30 µm for standard single chip pressure contact devices.
Prior Art 4—Patent CN103579165—Full-pressure-welding power device—State Grid Corp China
  An example of a compliance approach using disc springs within a ceramic housing.
Prior Art 5—Patent JP2004158489—Honda Motor Co Ltd
  An example of a compliance approach using pressurised fluid to provide uniform loading to the pressure contact components within the device.
Prior Art 6—Tinschert et al (2015)—Possible Failure Modes in Press-Pack IGBTs
  This paper investigates the poor reliability of traditional design press-pack IGBT devices. The authors conclude that the premature failures are the result of a mixture of over-pressurisation and under-pressurisation of certain chips in a device. Under-pressurisation particularly affects chips located at the edge of the device. This paper shows that with a ΔTj of 78° C. the cycles to failure is approximately 6,000 cycles for an IXYS UK Westcode multi-chip pressure contact devices of rigid construction. This compares unfavourably with single chip pressure contact devices, for which at a ΔTj of 80° C. the cycles to failure is far in excess of 100,000 cycles.
Prior Art 7—Frank (2014) Power Cycle Testing of Press-Pack IGBT Chips
  This thesis details follow up work from the study by Tinschert et al (2015) (prior art 6). Individual press-pack IGBT chips are subjected to power cycling. The author found that individual chips have a lifetime that is orders of magnitude greater than fully-assembled devices.

SUMMARY

According to one aspect of the present invention there is provided a semiconductor device sub-assembly comprising:
  a plurality of semiconductor units laterally spaced to one another;
  a plurality of conductive blocks operatively coupled with the plurality of semiconductor units;
  a conductive malleable layer operatively coupled with the plurality of conductive blocks, wherein the plurality of conductive blocks are located between the conductive malleable layer and the plurality of semiconductor units;
  wherein, in use, at least some of the plurality of conductive blocks are configured to apply a pressure on the conductive malleable layer, when a predetermined pressure is applied to the semiconductor device sub-assembly.

A substantially uniform pressure distribution is achieved by flexing the malleable layer to a predetermined level. The invention presented here is a unique solution to the problem of improving pressure uniformity across a power device, e.g. a press-pack IGBT device. It greatly simplifies the assembly process. It allows chips to be packed very densely (and so a higher overall current rating per device).

At least some of the conductive blocks may be configured to flex the conductive malleable layer The sub-assembly may further comprise a stand-off plate operatively connected with an opposing surface of the conductive malleable layer compared to a surface of the conductive malleable layer to which the conductive block is coupled. The conductive block is generally in contact with a first surface of the malleable layer and the stand-off plate is coupled with a second opposing surface of the malleable layer.

The stand-off plate may comprise a plurality of holes or voids. During the operation of the sub-assembly, the conductive malleable layer may be flexed into each hole of the stand-off plate by each conductive block. This flexing technique helps to provide substantially uniform pressure distribution across all the devices of the sub-assembly.

The thickness of the conductive malleable layer may be chosen such that the conductive malleable layer is at least elastically deformed. The yield strength of a material of the conductive malleable layer may be chosen such that the conductive malleable layer is at least plastically deformed by the conductive block under the applied pressure.

The conductive malleable layer may be at least plastically deformed at an elevated temperature between −50° C. and 150° C.

The conductive malleable layer may be a flat diaphragm. The conductive malleable layer may be a continuous layer, preferably without any contoured hole or recess into it.

The thickness of the conductive malleable layer may be from about 0.1 mm to 10 mm.

The conductive malleable layer may comprise a material comprising copper, stainless steel, aluminium, silver, or an alloy of copper, aluminium, stainless steel and silver.

The conductive block may comprise a material comprising copper, aluminium, silver, or an alloy of copper, aluminium, and silver.

The stand-off plate may comprise a material comprising copper, aluminium, silver, or an alloy of copper, aluminium, and silver.

The conductive malleable layer and conductive blocks may be formed using one piece of material. The stand-off plate and conductive malleable may be formed using one piece of material. The stand-off plate, conductive malleable layer and conductive blocks may be formed using one piece of material.

The sub-assembly may further comprise a semiconductor unit locator comprising a plurality of holes. At least some of the plurality of semiconductor units are located in at least some holes of the semiconductor unit locator.

The semiconductor unit locator may comprise a plurality of ribs and the holes of the semiconductor unit locator are formed by the plurality of ribs.

Each semiconductor unit may be located in each hole of the semiconductor unit locator.

Some semiconductor units may be located in one hole and some other semiconductor units are located in another hole.

The semiconductor units may be arranged such that some semiconductor units have no ribs between two adjacent semiconductor units. At least some of the ribs may extend to a full width of the unit locator.

At least some of the ribs may be located in a central region of the semiconductor unit locator. At least some of the holes of the semiconductor unit locator may have a square shape.

The shape of the holes of the semiconductor unit locator may control the applied pressure distribution to each semiconductor unit so that the applied pressure is distributed substantially uniformly in a central region of the sub-assembly.

The semiconductor unit locator may comprise a material comprising polyether ether ketone (PEEK).

The sub-assembly may further comprise a plurality of pressure means for applying pressure to the plurality of the semiconductor units. The conductive malleable layer may be located between the plurality of pressure means and the semiconductor unit locator.

The pressure means may comprise a spring. The sub-assembly may further comprise a spring locator comprising a plurality of holes. Each pressure means may be located in each hole of the spring locator.

The spring locator may be operatively connected with the conductive malleable layer.

The sub-assembly may further comprise a first thrust pad and a second thrust pad within the holes of the spring locator on both sides of the pressure means. The first thrust pad may be protruded from a first surface of the spring locator and the second thrust pad may be in contact with the conductive malleable layer.

The first and second thrust pad may each comprise a material comprising a metal. The first and second thrust pad and the pressure means may be integrated into a discrete component.

The pressure means may be selected such that a predetermined pressure is exerted using the spring locator, the pressure means, the first thrust pad and the second thrust pad. The predetermined pressure may be applied to a threshold pressure limit so that the applied pressure compresses each pressure means to a degree that a lower most surface of the first thrust pad is in line with a lower most surface of the spring locator.

The threshold pressure limit to each pressure means may be about 1 Kilo Newton.

The applied pressure above the threshold pressure limit may be supported by the spring locator and the semiconductor unit locator.

The spring locator and the semiconductor unit locator may be connected to one another using a fixing means. The fixing means may comprise non-conductive screws.

The sub-assembly may be configured such that after the pressure is applied a first conductive path is established through the spring locator, conductive malleable layer, conductive block and the semiconductor unit.

The sub-assembly may be configured such that after the pressure is applied a second conductive path is established through the first thrust pad, the pressure means, the second thrust pad, the conductive malleable layer, the conductive block and the semiconductor unit.

The sub-assembly may further comprise a printed circuit board on the conductive malleable layer, the printed circuit board is configured to distribute a control signal applied to a control terminal of the semiconductor unit. The printed circuit board may comprise a plurality of holes, each hole being aligned with each hole of the stand-off plate. Each conductive block may be located in each hole of the printed circuit board.

The sub-assembly may be configured such that after the pressure is applied a conductive path is established through the semiconductor unit, conductive block, conductive malleable layer, and stand-off plate.

The semiconductor unit may comprise:
a semiconductor chip;
a protection layer at the edge of the semiconductor chip;
a front side strain buffer;
a back side strain buffer;
a control terminal connection spring pin.

The backside strain buffer may be a disc covering all the chips within the sub-assembly.

The backside strain buffer may comprise any one of aluminium-graphite, molybdenum and molybdenum-copper.

The sub-assembly may further comprise a metal layer between the semiconductor chip and the frontside and backside strain buffers The front side strain buffer and the back side strain buffer may be attached to the semiconductor chip by a soldering technique.

The front side strain buffer and the back side strain buffer may be attached to the semiconductor chip by a silver sintering technique.

The sub-assembly may have a square or circular shape.

The sub-assembly may further comprise a deflection limiting frame between the conductive malleable layer and semiconductor unit. The deflection limiting frame may comprise polyether ether ketone (PEEK).

According to a further aspect of the present invention, there is provided a method for manufacturing a semiconductor device sub-assembly, the method comprising:
- providing a plurality of semiconductor units laterally spaced to one another;
- providing a plurality of conductive blocks operatively coupled with the plurality of semiconductor units; and
- providing a conductive malleable layer operatively coupled with the plurality of conductive blocks, wherein the plurality of conductive blocks are located between the conductive malleable layer and the plurality of semiconductor units, wherein, in use, at least some of the plurality of conductive blocks are configured to apply a pressure on the conductive malleable layer, when a predetermined pressure is applied to the semiconductor device sub-assembly.

Individual semiconductor chips can be connected in parallel within a single pressure contact housing to provide a single device containing multiple chips with a current handling capability that is ideally the sum of the capability of all the chips contained within the housing.

According to a further aspect of the present invention, there is provided a semiconductor device sub-assembly comprising:
- a plurality of semiconductor units laterally spaced to one another;
- a semiconductor unit locator comprising a plurality of holes, wherein each semiconductor unit is located in each hole of the semiconductor unit locator;
- a plurality of pressure means for applying pressure to each semiconductor unit, and
- a conductive malleable layer located between the plurality of pressure means and the semiconductor unit locator.

The conductive malleable layer may be a flat diaphragm. The conductive malleable layer may be a continuous layer without a contoured area in the malleable layer. The conductive malleable layer may be a flexible layer. The conductive malleable layer may comprise a material comprising copper, aluminium, silver and an alloy of copper, aluminium and silver.

The pressure means may comprise a spring. The spring can be any type of springs for example a disc spring.

The sub-assembly may further comprise a spring locator comprising a plurality of holes, wherein each pressure means is located in each hole of the spring locator.

The spring locator may be operatively connected with the conductive malleable layer.

The sub-assembly may further comprise a first thrust pad and a second thrust pad within the holes of the spring locator on both sides of the pressure means, wherein the first thrust pad is protruded from a first surface of the spring locator and the second thrust pad is in contact with the conductive malleable layer. The first and second thrust pad may each comprise a material comprising a hard metal.

The pressure means may be selected such that a predetermined pressure is exerted using the spring locator, the pressure means, the first thrust pad and the second thrust pad. The predetermined pressure may be applied to a threshold pressure limit so that the applied pressure compresses each pressure means to a degree that a lower most surface of the first thrust pad is in line with a lower most surface of the spring locator.

The threshold pressure limit to each pressure means may be about 1 Kilo Newton.

The applied pressure above the threshold pressure limit may be supported by the spring locator and the semiconductor unit locator. The spring locator and the semiconductor unit locator may be connected to one another using a fixing means.

The fixing means may comprise non-conductive screws.

The sub-assembly may further comprise a printed circuit board on the conductive malleable layer, the printed circuit board is configured to distribute a control signal applied to a control terminal of the semiconductor unit.

The printed circuit board may comprises a plurality of holes, each hole being associated with each semiconductor unit and with each pressure means.

The sub-assembly may further comprise a conductive block in each hole of the printed circuit board. The conductive block may be operatively connected with the conductive malleable layer and the semiconductor unit. The conductive block may comprise a material comprising copper, aluminium, silver and an alloy of these materials.

The sub-assembly may be configured such that after the pressure is applied a first conductive path is established through the spring locator, conductive malleable layer, conductive block and the semiconductor unit.

The sub-assembly may be configured such that after the pressure is applied a second conductive path is established through the first thrust pad, the pressure means, the second thrust pad, the conductive malleable layer, the conductive block to the semiconductor unit.

The semiconductor unit may comprise:
- a semiconductor chip;
- a protection layer at the edge of the semiconductor chip;
- a front side strain buffer;
- a back side strain buffer;
- a control terminal connection spring pin.

Each hole of the semiconductor unit locator may have a square shape.

The shape of each hole of the semiconductor unit locator may control the applied pressure distribution to each semiconductor unit so that the applied pressure is distributed substantially uniformly in a central region of the sub-assembly.

The semiconductor unit locator may comprise a high temperature material comprising polyether ether ketone (PEEK).

According to a further aspect of the present invention, there is provided a method for manufacturing a semiconductor device sub-assembly, the method comprising:
- providing a plurality of semiconductor units laterally spaced to one another;
- providing a semiconductor unit locator comprising a plurality of holes, wherein each semiconductor unit is located in each hole of the semiconductor unit locator;
- providing a plurality of pressure means for applying pressure to each semiconductor unit, and
- providing a conductive malleable layer located between the plurality of pressure means and the semiconductor unit locator.

BRIEF DESCRIPTION OF THE PREFERRED EMBODIMENTS

Some preferred embodiments of the invention will now be described by way of example only and with reference to the accompanying drawings, in which.

DETAILED DESCRIPTION OF THE PREFERRED EMBODIMENTS

Figure 1:
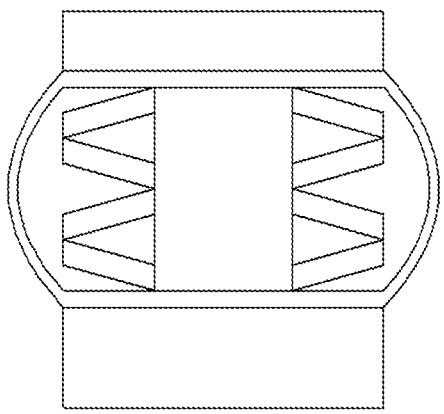
FIG. 1 illustrates a disc spring stack and current bypass strips according to prior art.
Figure 2:
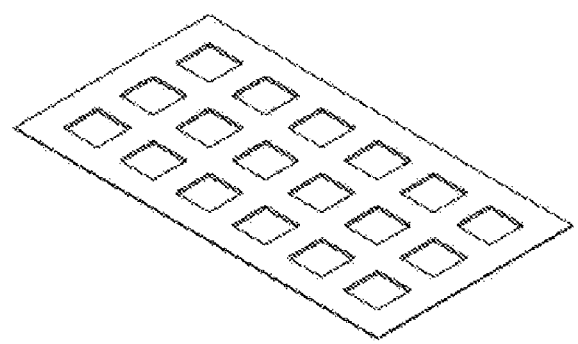
FIG. 2 illustrates a stamped, contoured metal sheet according to prior art.
Figure 3:
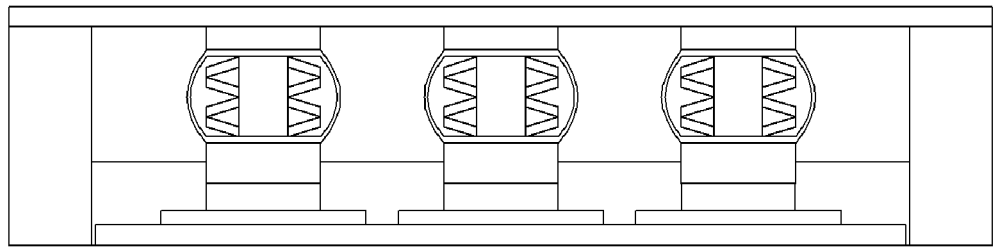
FIG. 3 illustrates the operation of ABB's StakPak in which a rigid insulative sleeve is included according to prior art.

FIGS. 4 to 20 (excluding FIG. 6) generally describe different embodiments of the present invention. In these figures, the following components are used with reference to the following reference numerals.

Figure 4:
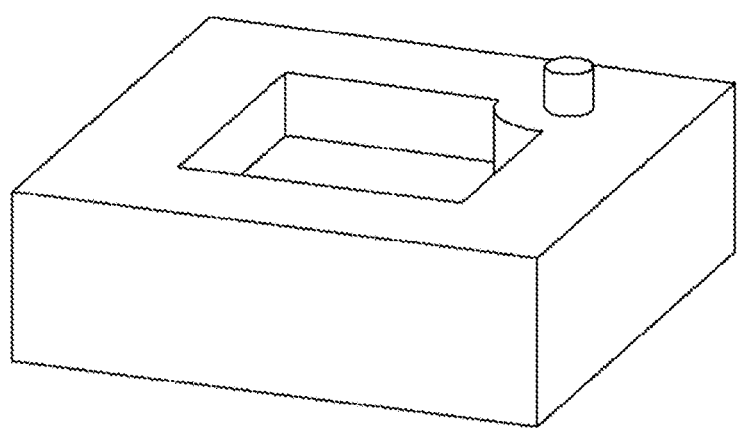
FIG. 4 illustrates a three-dimensional view of a finished semiconductor unit according to one embodiment of the present invention.

1—a semiconductor unit;
2—a semiconductor chip, in this application is either an Insulated Gate Bipolar Transistor or Fast Recovery Diode, but other types of chips could be used;
3—Moulded locator—may be a high temperature plastic including polyether ether ketone (PEEK)
4—Front-side strain buffer—may comprise molybdenum, tungsten or an alloy of molybdenum and copper or tungsten and copper;
5—Backside strain buffer—same as front side strain buffer;
6—Control terminal connection spring pin—may be a gold-plated stainless steel;
7—Device housing base/main electrode—may be copper;
8—Control signal distribution printed circuit board—may be a standard high-temperature PCB material;
9—Device housing lid/main electrode—may be copper;
10—Standoff plate—may be copper, but may be any suitably conductive metal, such as aluminium, silver, or an alloy of these;
11—Conductive diaphragm or conductive malleable layer—may be copper, but may be any suitable conductive metal, such as spring steel, aluminium or silver, or an alloy of these;
12—Conductive block—may be copper, but may be any suitably conductive metal, such as aluminium, silver, or an alloy of these;
13—Deflection limiting frame—may be a high temperature plastic.
100—Spring locator—copper, but could be any suitably conductive metal, such as aluminium, silver, or an alloy of these;
110—First thrust pad—steel (preferably a stainless steel), but could be any suitable hard metal;
120—Disc spring stack—a standard grade of high-temperature spring steel;
130—Second thrust pad—same as first thrust pad;
160—Semiconductor unit locator—polyether ether ketone (PEEK) or other high temperature plastic;
161—Semiconductor unit locator—polyether ether ketone (PEEK) or other high temperature plastic;
600—Metal electrode FIG. 4 illustrates a three-dimensional view of a finished semiconductor unit according to one embodiment of the present invention.

Figure 5:
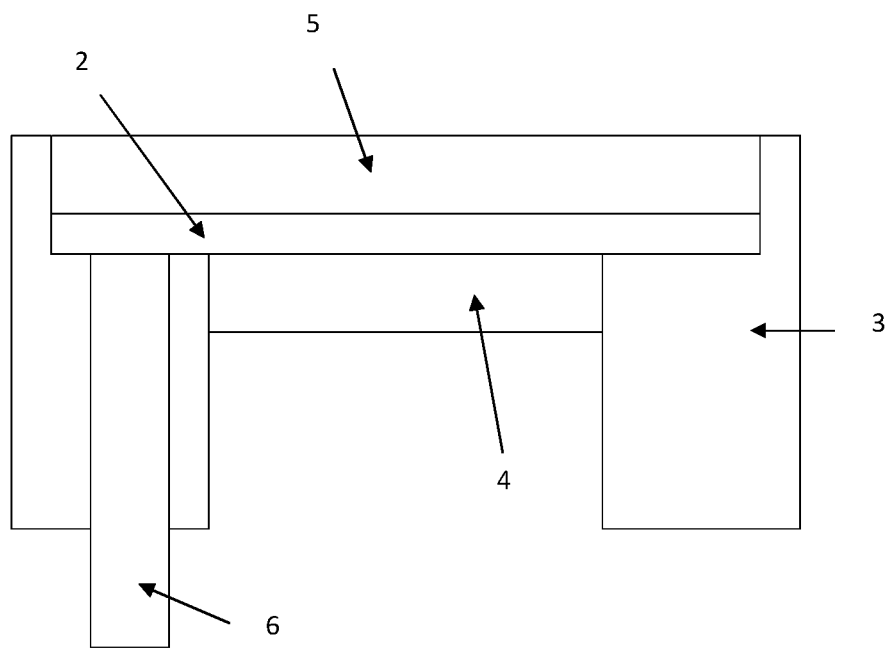
FIG. 5 illustrates a schematic cross-section of a semiconductor unit according to one embodiment of the present invention.
Figure 6:
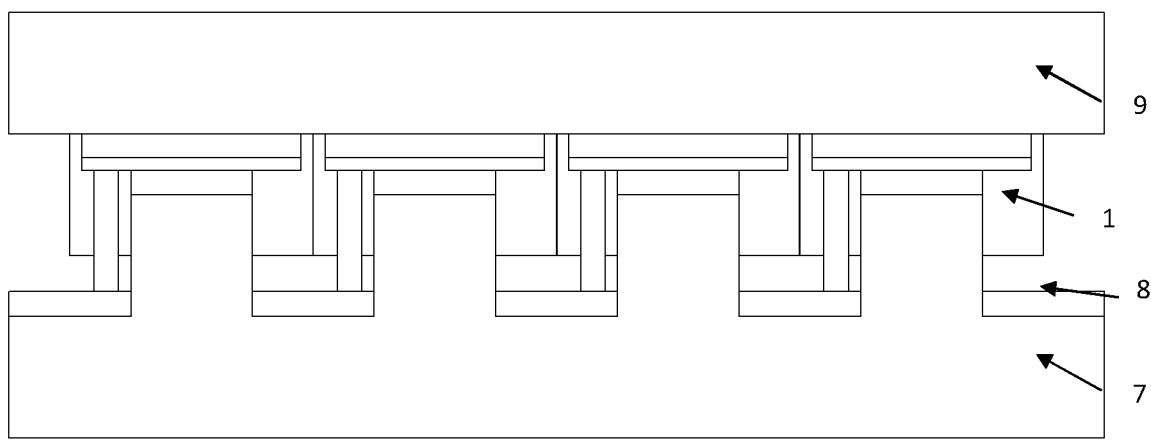
FIG. 6 illustrates a schematic cross-section of an assembled device of a prior art construction containing multiple semiconductor units.

FIG. 5 illustrates a schematic cross-section of the semiconductor unit of FIG. 4. In one embodiment, the semiconductor unit includes a semiconductor chip 2, for example, an insulated gate bipolar transistor (IGBT), metal oxide semiconductor field effect transistor (MOSFET), bipolar junction transistor (BJT) or any other type of semiconductor devices. The unit includes a frontside strain buffer 4 and a backside strain buffer 5. The unit 1 also includes a control terminal connection spring pin 6. The unit 1 also includes a moulded locator 3 that serves to locate the frontside strain buffer 4, backside strain buffer 5 and control terminal connection spring pin 6 relative to the semiconductor chip 2.

In one embodiment, the backside strain buffer 5 may not be an individual component for each chip, but may be one large disc of this material that covers all of the chips in the device. The frontside and backside strain buffer material may also be aluminium-graphite, as well as one of the materials already listed above.

In one embodiment, the lip on the semiconductor unit moulded locator 3 that locates the backside strain buffer 5 may be removed. With this lip removed, the backside strain buffers will be free to move out of alignment laterally, so a method to hold them in place will be required. In the case that an individual backside strain buffer is used for each semiconductor unit and is not bonded to the chip, this would be a plastic grid with square holes that is fixed to the semiconductor unit locator over which a thin cover of aluminium or copper is fixed to prevent the backside strain buffers from falling out of the grid if the device is turned upside down. If the backside strain buffer design is either individual squares bonded to the chip or is made using one large disc, such a locator and cover, will not be needed.

An intermediate soft metal layer may be included between the chip and the frontside and backside strain buffers. This intermediate layer may be a soft metal, such as aluminium, copper, silver, indium or a tin-silver solder preform.

The control terminal connection spring pin 6 may not be held by the semiconductor unit, but instead may be mounted in a separate plastic part between the semiconductor unit and the PCB. This would take the form of a thin sheet with holes drilled in the required places, which is laid onto the PCB. This separate plastic part will be located laterally by the semiconductor unit locator.

Figure 7:
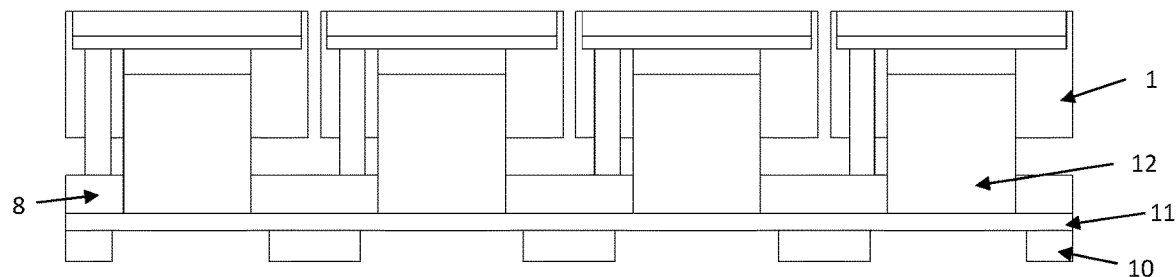
FIG. 7 illustrates a schematic cross-section of a semiconductor sub-assembly according to one embodiment.

FIG. 7 illustrates a schematic cross-section of a semiconductor sub-assembly according to one embodiment of the present invention. The sub-assembly includes the semiconductor units 1 laterally spaced from one another. Each semiconductor unit 1 is coupled (or operatively connected) with a conductive block 12. There is provided a conductive diaphragm 11 which is coupled with each conductive block 12. The conductive block 12 touches a first surface of the conductive diaphragm 11. The sub-assembly also includes a stand-off plate 10 operatively coupled or connected to a second surface of the conductive diaphragm 11. The second surface of the diaphragm 11 is an opposing surface of the first surface of the conductive diaphragm 11. In other words, the conductive diaphragm 11 is located in between the stand-off plate 10 and conductive block 12. Similarly, the conductive block 12 is located between the semiconductor units 1 and the conductive diaphragm 11. The stand-off plate 10 includes a plurality of holes, each of which is substantially aligned with each conductive block 12. Therefore when a mechanical load is applied to the sub-assembly, each conductive block 12 forces the conductive diaphragm 11 to flex into each hole of the stand-off plate 10. The sub-assembly also includes a printed circuit board 8 coupled with the conductive diaphragm 11 and the semiconductor unit 1. The printed circuit board 8 includes a plurality of holes each are aligned with each hole of the stand-off plate 10.

Broadly speaking, the technical aspects of the embodiment of FIG. 7 are as follows:

1. The sub-assembly uses a flat, conductive diaphragm 11 and standoff plate 10 as a spring mechanism to provide improved pressure uniformity compared to the traditional construction shown in FIG. 6. This approach simplifies the assembly process greatly when compared to design approaches using large numbers of disc springs.
2. The sub-assembly uses a flat, conductive diaphragm 11 and standoff plate 10 to provide the current bypass path. The use of this approach wastes minimal contact area, compared to the longitudinal bypass strips that bow laterally or the stamped, contoured metal sheet that requires area to accommodate the formed contours and so permits the maximum chip packing density and therefore the maximum current density for the finished device of all current bypass methods available.
3. The design may be a fully-functional sub-assembly. It does not use a final outer packaging—typically a ceramic housing—for testing to be carried out. Other designs encountered do require final assembly to be fully functional. Since large-area ceramic housings are expensive components and failure of the device results in irreparable damage to the contact surfaces within the ceramic housing, a cost-saving can be recognised by testing the sub-assembly before packaging, since some manufacturing yield loss is to be expected.
4. One embodiment of the invention uses the deflection of a single diaphragm, rather than the deflection of multiple disc springs stacked in series. This means the sub-assembly can be made much thinner than a sub-assembly using disc springs, which may offer benefits such as space-saving and weight-saving.

Figure 8:
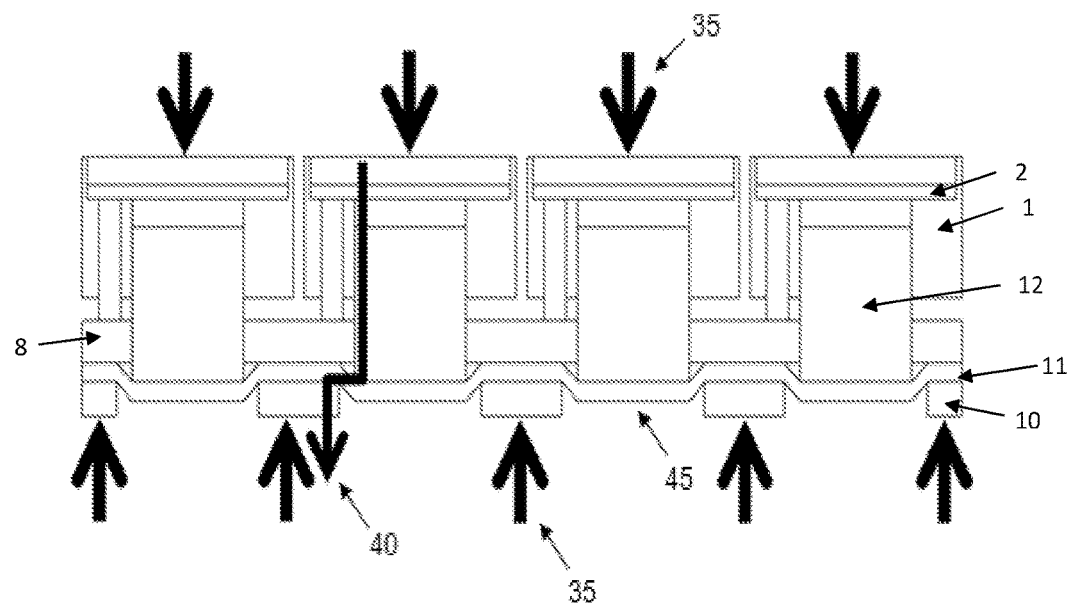
FIG. 8 illustrates a demonstration of conductive path through a semiconductor chip (jogged arrow), the mechanical loading (arrows around the periphery) and the deflection of the conductive diaphragm, in the embodiment of FIG. 7.

In the embodiment of FIG. 8, the conductive diaphragm 11 is placed onto the standoff plate 10. The conductive diaphragm 11 has a thickness specified to provide the desired spring characteristics and sufficient to carry the required current. Onto the conductive diaphragm 11 is placed a control signal distribution printed circuit board 8. This distributes the control signal applied to the single control terminal of the finished device to each of the individual semiconductor chips 2 within the device. Into holes in the control signal distribution printed circuit board 8 are placed conductive blocks 12. Onto each of these is placed a semiconductor unit 1. The semiconductor unit 1 comprises a semiconductor chip 2 with protection from electrical breakdown at the edge of the chip 3, frontside 4 and backside 5 strain buffers and a control terminal connection spring pin 6 (only for chips with a control terminal).

The sub-assembly may subsequently be assembled into a traditional ceramic capsule or other appropriate power semiconductor housing (not shown).

FIG. 8 illustrates a demonstration of conductive path 40 and mechanical load transmission 35. The conductive path 40 is formed through the semiconductor chip 2, conductive block 12, the diaphragm 11 and the stand-off plate 10. In one embodiment, the sub-assembly is operated by clamping the whole device to a specified load 35. In one example the specified load is about 50 to 70 kN. This mechanical load 35 forces the conductive blocks 12 into the conductive diaphragm 11, causing it to deflect locally within the voids 45 in the standoff plate 10, as shown in FIG. 8. The deflection-load characteristics are designed so that the force on each individual chip 2 is approximately equal.

Figure 9:
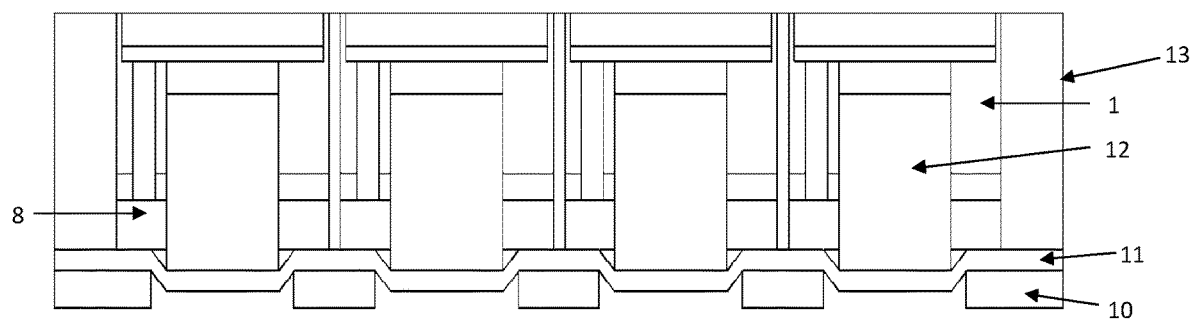
FIG. 9 illustrates an alternative semiconductor sub-assembly including a deflection limiting frame according to one embodiment of the invention.

FIG. 9 illustrates an alternative semiconductor sub-assembly including a deflection limiting frame 13 according to one embodiment of the invention. The other features of FIG. 9 are the same as those of FIG. 8 and therefore carry the same reference numbers.

Figure 10:
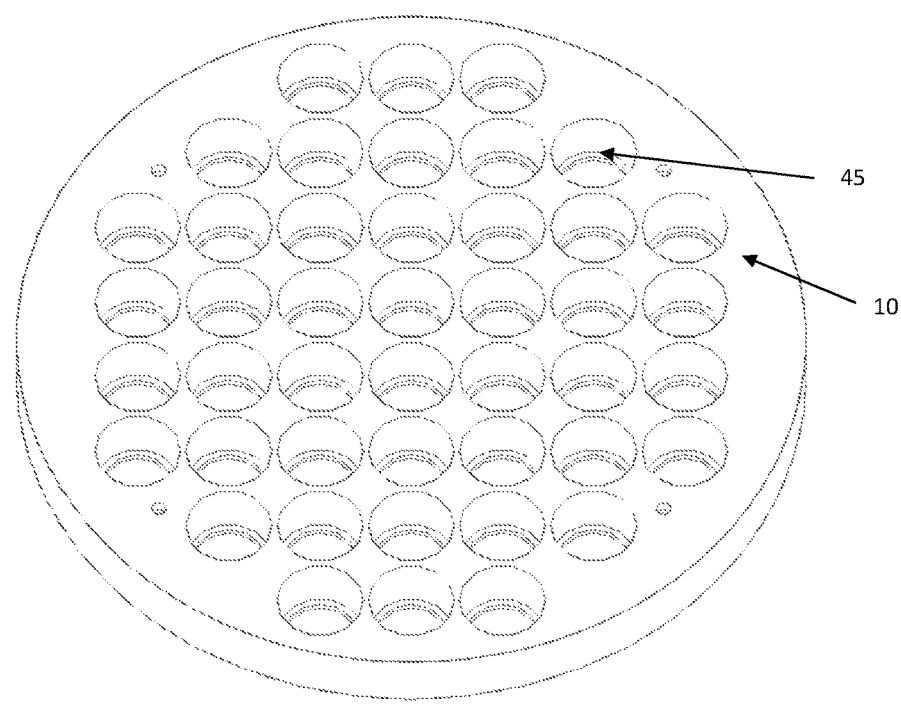
FIG. 10 illustrates a representation of a stand-off plate of the semiconductor sub-assembly.

FIG. 10 illustrates a representation of a stand-off plate 10 including through holes or voids 45. The conductive diaphragm 11 is generally flexed through each hole or void 45 of the stand-off plate 10.

Figure 11:
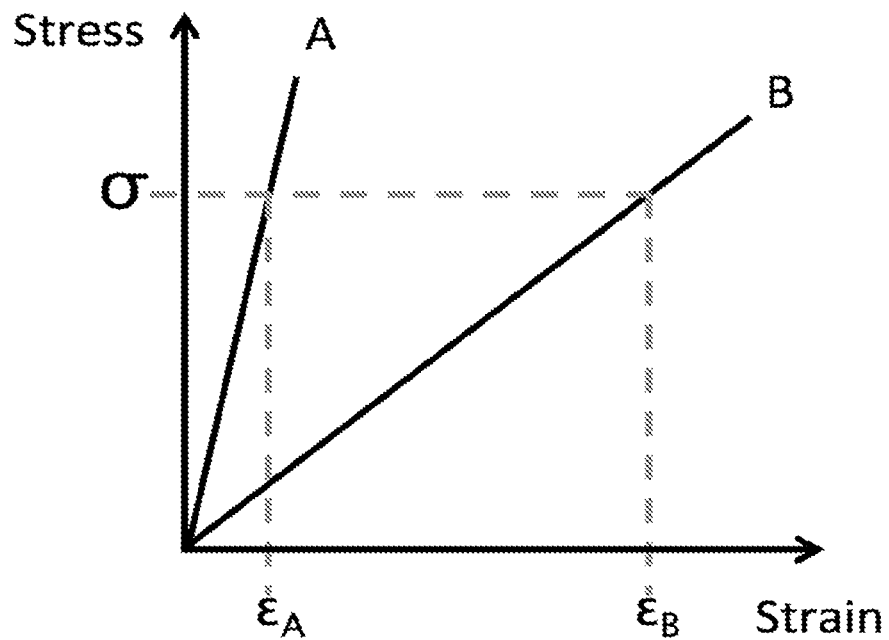
FIG. 11 illustrates a comparison of the embodiment of FIG. 7 with a conventional approach with regards to stress-strain relationship of a conductive diaphragm.

One embodiment of the invention uses the stress strain relationship of the conductive diaphragm 11. The material for the diaphragm may possess a high yield strength to limit the amount of plastic deformation to a tolerable level and maintain this behaviour at elevated temperatures (e.g. 125° C.). A suitable material would be stainless steel (e.g. X10 Cr Ni 18-8). FIG. 11 illustrates the different capabilities of the traditional construction (line A) and one embodiment of the invention (line B) to compensate for differences in thicknesses of the components (particularly the diaphragm) in the semiconductor unit. FIG. 11 illustrates the comparison using the sub-assembly of FIG. 7. It shows that when subjected to a given stress, a greater strain is achieved for one embodiment of the invention. This means that a larger variation in the thicknesses of the components (particularly the diaphragm) in the semiconductor unit can be tolerated. The graph assumes the materials used do not exceed their yield strength (i.e. the material is only elastically deformed).

Figure 12:
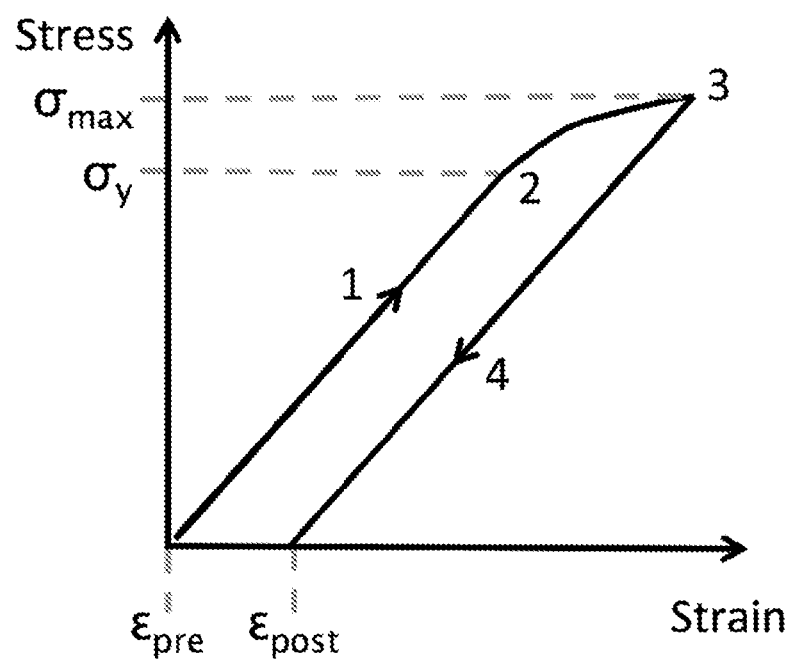
FIG. 12 illustrates a demonstration of an effect of plastic deformation on the stress-strain relationship of the conductive diaphragm.

FIG. 12 illustrates how a material typically reacts when its yield strength ($\sigma_y$) is exceeded (i.e. the material is plastically deformed). Initially (1), the material (e.g. the diaphragm material) reacts as for the elastic scenario in the first graph. When the material is stressed beyond its yield strength (2), it begins to plastically deform until the maximum applied stress is reached (3). At this point, if the stress is removed (4), the strain will decrease to a value that is equal to zero plus the amount of plastic deformation ($\varepsilon_{post}$). This relationship is used in conjunction with that in the first graph to enable an embodiment of the invention to tolerate even greater differences in the thicknesses of the components in the semiconductor units.

It will be appreciated that the specified load for the finished device may be determined by the load required for optimum pressure contact to the semiconductor chip. This is determined by balancing electrical and thermal conductivity of the pressure contact with the long-term reliability. In general, a higher force will result in better conductivity, but a shorter lifetime, whereas a lower force will result in poor conductivity and longer lifetime.

The skilled person would appreciate that so far only a mechanical prototype has been produced. These will require whole device clamping forces that differ from the about 50-70 kN specified for the prototype. The device may have a ~225 mm electrode, but different sizes are possible. The smallest device may have a ~47 mm electrode.

Finished devices of different diameters may be manufactured as necessary. The device may be circular or may be square, although other shapes are possible. The diaphragm 11 thickness may be in the range of 0.1 mm to 10 mm. The diaphragm 11 may be made of spring steel, copper, aluminium, silver or an alloy of these materials.

The front side 4 and backside 5 strain buffers may or may not be attached to the semiconductor chip 2 by soldering or silver sintering.

The conductive block 12 and the frontside strain buffer 4 may be formed of one piece of material. This may or may not be attached to the frontside of the semiconductor chip 2 by soldering or silver sintering.

The standoff plate 10 and conductive diaphragm 11 may be formed of one piece of material. The conductive diaphragm 11 and conductive blocks 12 may be formed of one piece of material. The standoff plate 10, conductive diaphragm (or conductive malleable layer) 11 and conductive blocks 12 may be formed of one piece of material.

In one embodiment, a mechanism that limits the deflection of the diaphragm may be added, in order to control the level of pressure that is applied to the semiconductor chips. This will take the form of a frame 13 that takes up the mechanical loading once a predetermined level of deflection (determined by the load-deflection characteristics of the diaphragm) has been reached.

The proposed sub-assembly is a unique solution to the problem of improving pressure uniformity across a press-pack IGBT device. It allows chips to be packed very densely (and so a higher overall current rating per device) which is generally very advantageous.

Figure 13:
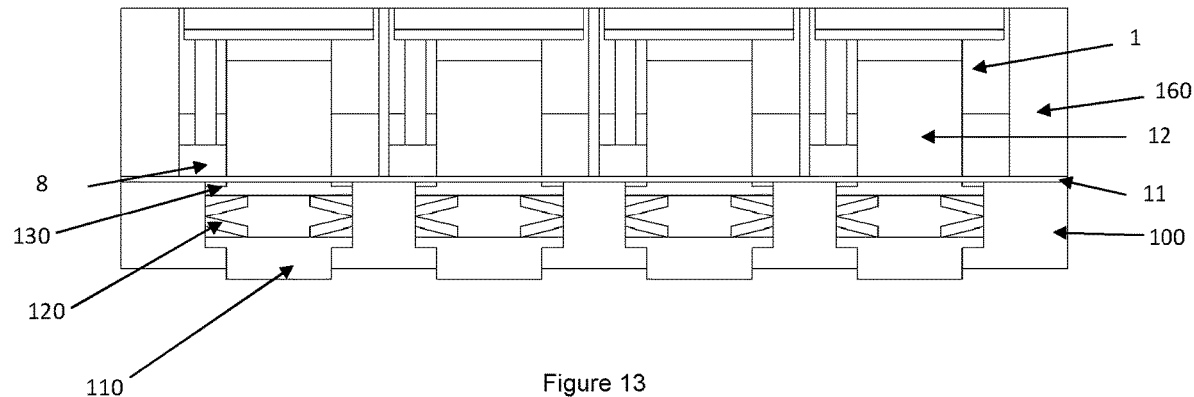
FIG. 13 illustrates a schematic cross-section of a semiconductor sub-assembly according to one embodiment.
Figure 14:
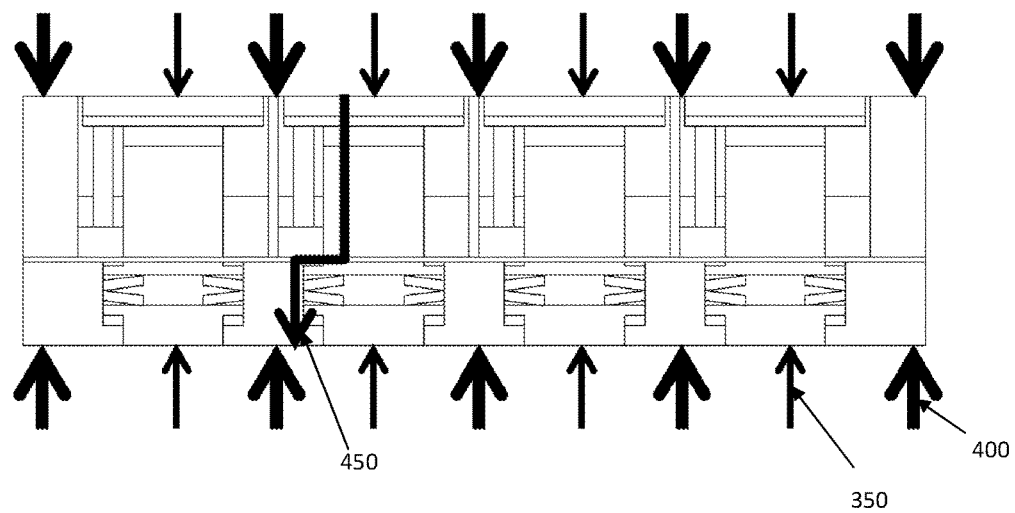
FIG. 14 illustrates a demonstration of conductive path (solid arrow through the device) and mechanical load transmission (solid arrows outside the device) once the invention is mechanically loaded; thin solid arrows indicate load on chips and thick solid arrows indicate the transmission of load above the threshold load to the sub-assembly frame.

FIG. 13 illustrates a schematic cross-section of a semiconductor sub-assembly according to one embodiment of the present invention. This embodiment is generally a multiple-chip semiconductor device sub-assembly that incorporates for example stacks of disc springs in line with each semiconductor unit, uses an internal support frame (combination of spring locator and semiconductor unit locator) to limit the displacement of the disc springs and provides current bypass of the disc springs using a disc with multiple through holes and a flat, malleable, conductive diaphragm (or the conductive malleable layer). One embodiment of the invention is generally shown in FIGS. 13 and 14. This embodiment is also directed to providing uniform pressure distribution across the chip of the sub-assembly (as the embodiments of FIGS. 7 and 8).

The technical aspects of the embodiments of FIGS. 13 to 20 are as follows:

1. The sub-assembly uses a flat, malleable, conductive diaphragm and disc with multiple through holes (elements 11 and 100 in FIG. 13) to provide the current bypass path. The use of this approach wastes minimal contact area, compared to the longitudinal bypass strips that bow laterally or the stamped, contoured metal sheet that requires area to accommodate the formed contours and so permits the maximum chip packing density and therefore the maximum current density for the finished device of all current bypass methods available.

2. The design may be a fully-functional sub-assembly, utilising both disc springs for improved pressure uniformity and a travel-stop mechanism to prevent over-pressurisation of the chips that contains the full number of chips present in the final device. It does not use the final outer packaging—typically a ceramic housing—for testing to be carried out or in fact to be used in an end-user's application, if that were ever desired. All other designs using disc springs encountered do require final assembly to be fully functional. Since large-area ceramic housings are expensive components and failure of the device results in irreparable damage to the contact surfaces within the ceramic housing, a cost-saving can be recognised by testing the sub-assembly before packaging, since some manufacturing yield loss is to be expected.

In the embodiment of FIG. 13, the first thrust pads 110, disc spring stacks 120 and a second thrust pad 130 are inserted into holes in the spring locator 100. The disc spring stacks 120 are selected to exert the required pressure on the component stack at a displacement determined by the combined height of the first thrust pad 110, disc spring stack 120 and the second thrust pad 130, minus the height of the spring locator 100.

Furthermore, over the top of the spring locator 100 is placed a conductive diaphragm 11. This has a thickness adequate to carry the required current, but is thin enough to flex with the movement of the disc spring stack 120 under load.

Onto the conductive diaphragm 11 is placed a control signal distribution printed circuit board 8. This distributes the control signal applied to the single control terminal of the finished device to each of the individual semiconductor chips 2 within the device. Into holes in the control signal distribution printed circuit board 8 are placed conductive blocks 12. Over these are then placed a semiconductor unit locator 160 with an array of square through-holes. Into each of the square through-holes is placed a semiconductor unit 1. The semiconductor unit 1 in this application comprises a semiconductor chip 2 with protection from electrical breakdown at the edge of the chip 3, frontside 4 and backside 5 strain buffers and a control terminal connection spring pin 6 (only for chips with a control terminal). At this stage, the semiconductor unit locator 160 is typically fixed to the spring locator 100 using non-conductive screws or another appropriate method, securing all loose components inside the subassembly.

The embodiment of FIGS. 13 and 14 may subsequently be assembled into a traditional ceramic capsule or other appropriate power semiconductor housing (not shown).

In an embodiment the spring components and thrust pads may be made into a discrete sub-assembly before being inserted into the spring locator plate. This may involve attaching the lower and upper thrust pad to one another in a way that allows their free movement whilst holding them and the springs together.

FIG. 14 illustrates a conductive path (solid arrow through the device) 450 and mechanical load transmission (solid arrows outside the device) 350, 400 once the invention is mechanically loaded; thin solid blue arrows 350 indicate load on chips and thick solid blue arrows 400 indicate the transmission of load above the threshold load to the subassembly frame. In one embodiment, the invention is operated by clamping the whole device to a load greater than that which depresses the disc springs in each component stack to such a degree that the lowermost surface of the first thrust pad 110 is brought into line with the lowermost surface of the spring locator 100 (the threshold load). The threshold load for each spring stack is designed to be 1 kN. In this example, there are 44 spring stacks in the current design, so the threshold load for the whole sub-assembly is therefore 44 kN. Beyond the threshold load, all extra load is supported by the semiconductor unit locator 160 and the spring locator 100. The rated load for the whole device is 50-70 kN, so the excess load supported by the semiconductor unit locator 160 and spring locator 100 is from 6 to 26 kN. At this point, the individual chips are each generally optimally loaded. They are protected from over-pressurisation by the support frame and, given that the device is loaded in excess of the threshold load, they are generally not under-pressurised either. Once pressurised correctly, a conductive path is established, through the spring locator 100, conductive foil or diaphragm 11, conductive block 12 to the semiconductor unit 1 (see FIG. 14). A second conductive path is also established from the first thrust pad 110, disc spring stack 120, second thrust pad 130, conductive foil 11 and conductive block 12 to the semiconductor unit 1.

It will be appreciated that the load on each threshold load of each spring stack may be determined by the load required for optimum pressure contact to the semiconductor chip. This is determined by balancing electrical and thermal conductivity of the pressure contact with the long-term reliability. A higher force will result in better conductivity, but a shorter lifetime, whereas a lower force will result in poor conductivity and longer lifetime.

The skilled person would appreciate that so far only a mechanical prototype has been produced. The threshold load of 1 kN has been estimated. Once full testing is possible, the load of 1 kN may be changed. It is expected to remain within the range about 0.5 to 2.0 kN.

Finished devices of different diameters may be manufactured. The will require whole device clamping forces that differ from the 50-70 kN specified for the prototype. The device may have a 225 mm electrode, but even bigger are possible. The smallest device may have a 47 mm electrode.

The excess load over the threshold load may be necessary to create a good pressure contact between the conductive diaphragm and the spring locator. The excess load may be about 6 to 26 kN, but this may need to be increased to an even higher force, if the conductivity of the contact is not good enough.

The device may be circular or may be square, although other shapes are possible. The diaphragm 11 thickness may be about 0.3 mm, preferably in a range about 0.1 mm to 1 mm. The diaphragm 11 is flexible because of dimensional tolerances so that it is able to move. The diaphragm 11 may be made of copper, aluminium, silver or an alloy of these materials.

The front side 4 and backside 5 strain buffers may or may not be attached to the semiconductor chip 2 by soldering or silver sintering.

The conductive block 12 and the frontside strain buffer 4 may be formed of one piece of material. This may or may not be attached to the frontside of the semiconductor chip 2 by soldering or silver sintering.

Figure 15:
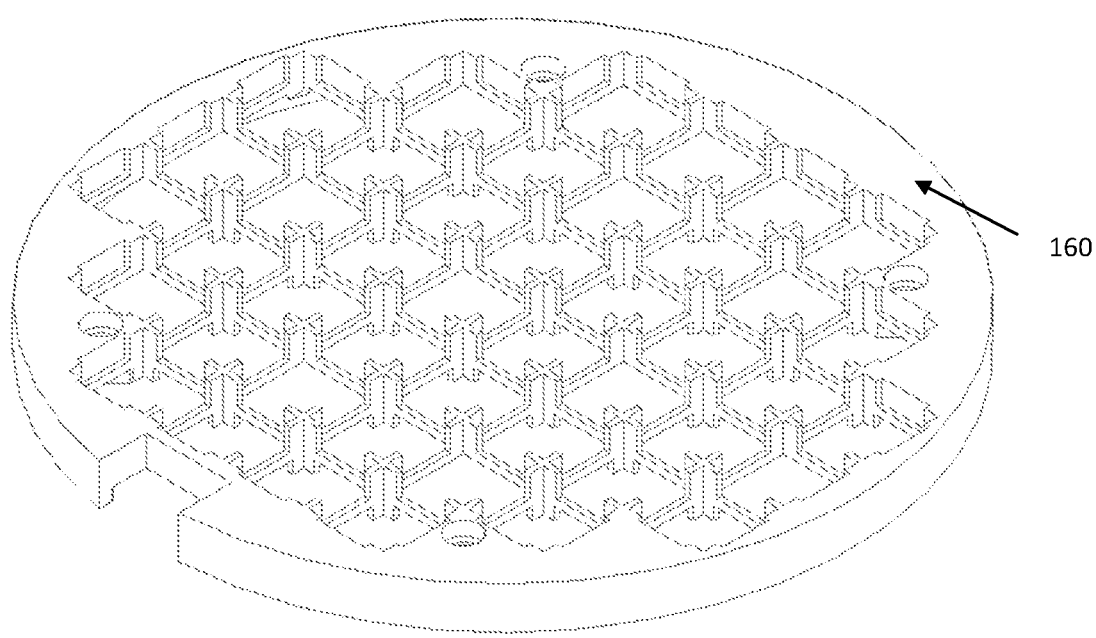
FIG. 15 illustrates a schematic representation of a semiconductor unit locator according to one embodiment of the present invention.

FIG. 15 illustrates a schematic representation of a semiconductor unit locator 160 according to one embodiment of the present invention. The unit locator 160 has square shaped through holes in which the semiconductor unit is located. There are cross-shaped boundaries for each hole which are very useful for providing uniform pressure at the central region of the sub-assembly.

Figure 16:
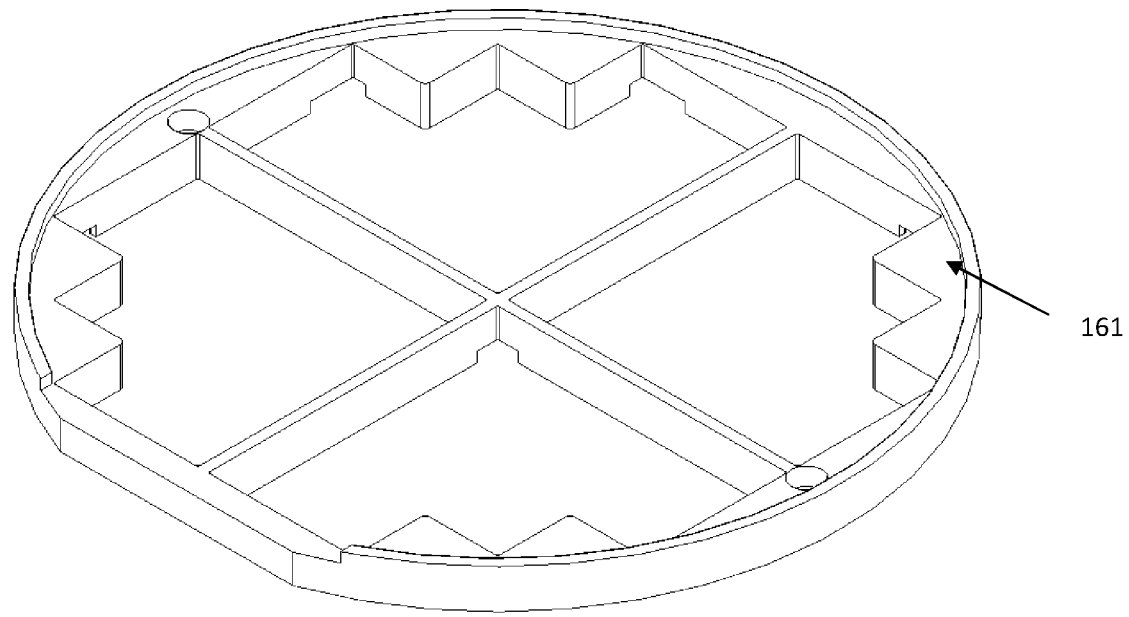
FIG. 16 illustrates a schematic representation of a semiconductor unit locator according to an embodiment of the present invention.

FIG. 16 illustrates a schematic representation of a semiconductor unit locator 161 according to one embodiment of the present invention. The unit locator 161 has fewer crosshairs and ribs than the unit locator 160, and further has thicker central ribs.

Figure 17:
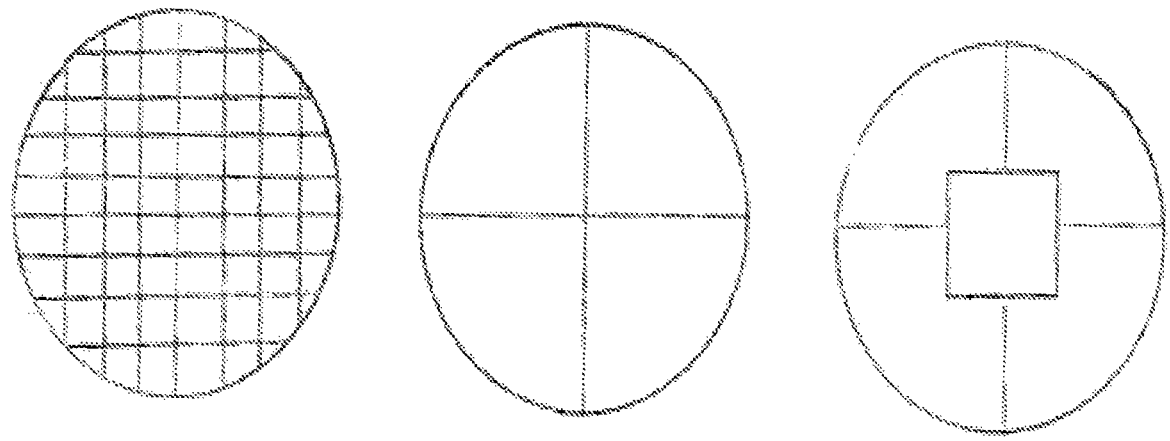
FIG. 17 illustrates schematic representations of various semiconductor unit locators according to embodiments of the present invention.

FIG. 17 illustrates schematic representations of various semiconductor unit locators according to embodiments of the present invention. Other rib spacings may be used, varying from having ribs between all semiconductor units to no inner ribs at all, or any variation in between. The more ribs there are, the better the pressure uniformity may be, but the larger the device may be (so the ratio of current rating to area will be reduced, which is considered to be a disadvantage in the common general knowledge). The pattern of the ribs may differ, for instance some ribs may not run across the full width of the locator. The arrangement for the ribs will likely depend on the diameter of the device being designed, with the smallest devices being likely to require no ribs.

Figure 18:
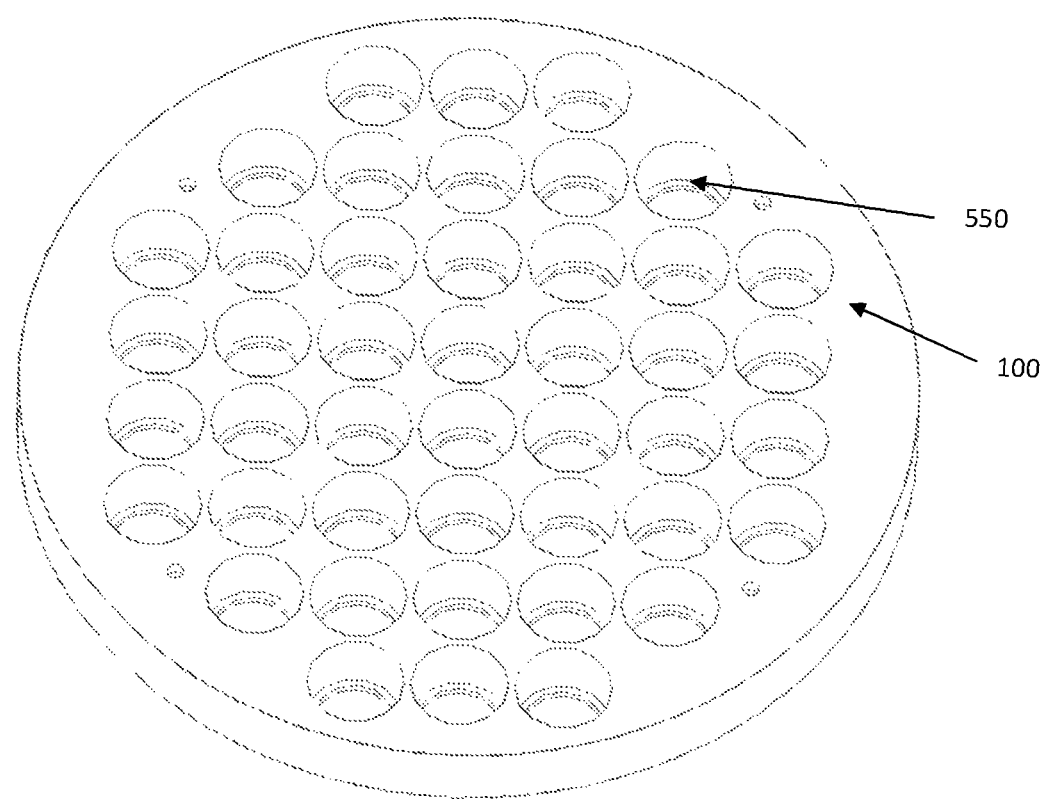
FIG. 18 illustrates a representation of a spring locator.

FIG. 18 illustrates a representation of a spring locator 100 including through holes 550.

Figure 19:
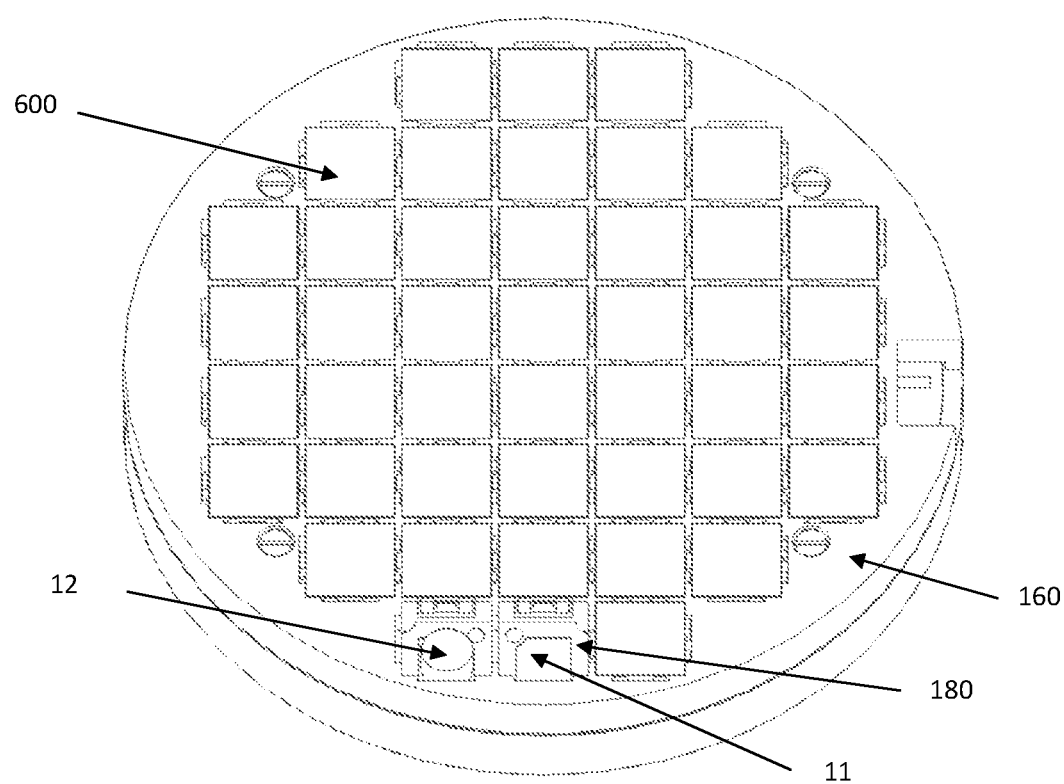
FIG. 19 illustrates a representation of a semi-assembled sub-assembly.

FIG. 19 illustrates a representation of a semi-assembled sub-assembly comprising semiconductor unit locator 160, diaphragm 11, printed circuit board 180 having square holes, conductive block 12, and backside strain buffers 5.

Figure 20:
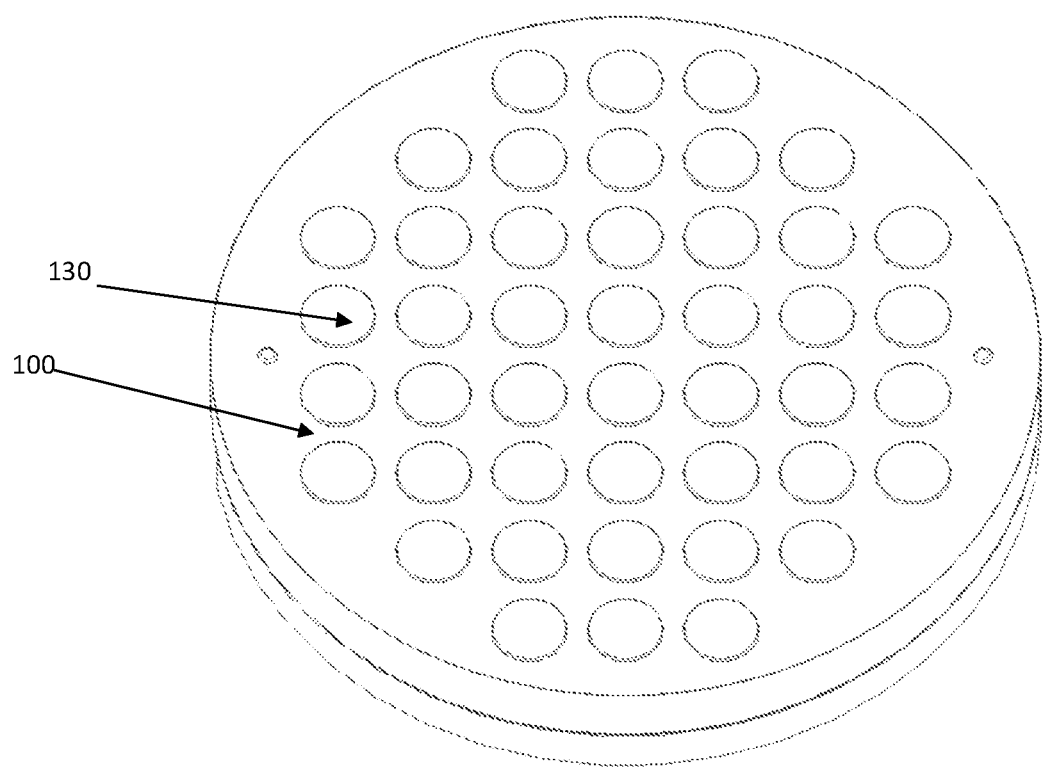
FIG. 20 illustrates a representation of a spring locator including thrust pads.

FIG. 20 illustrates a representation of a spring locator 100 including thrust pads 130. Although the above mentioned description is directed to a power semiconductor device chip but it would be appreciated that other semiconductor devices could also be possible to use in this invention.

The skilled person will understand that in the preceding description and appended claims, positional terms such as 'above', 'overlap', 'under', 'lateral', etc. are made with reference to conceptual illustrations of an device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein

The invention claimed is:

1. A semiconductor device sub-assembly comprising:
a plurality of semiconductor units laterally spaced to one another;
a plurality of conductive blocks operatively coupled with the plurality of semiconductor units;
a conductive malleable layer operatively coupled with the plurality of conductive blocks, wherein the plurality of conductive blocks are located between the conductive malleable layer and the plurality of semiconductor units; and
a stand-off plate operatively connected with an opposing surface of the conductive malleable layer compared to a surface of the conductive malleable layer to which the plurality of conductive blocks are coupled,
wherein, in use, at least some of the plurality of conductive blocks are configured to apply a pressure on the conductive malleable layer, when a predetermined pressure is applied to the semiconductor device sub-assembly.

2. The sub-assembly according to claim 1, wherein at least some of the conductive blocks are configured to flex the conductive malleable layer.

3. The sub-assembly according to claim 1, wherein the stand-off plate comprises a plurality of holes.

4. The sub-assembly according to claim 3, wherein, in use, the conductive malleable layer is flexed into at least some of the holes of the stand-off plate by the plurality of conductive blocks.

5. The sub-assembly according to claim 1,
wherein the thickness of the conductive malleable layer is chosen such that the conductive malleable layer is at least elastically deformed; and/or
wherein a yield strength of a material of the conductive malleable layer is chosen such that the conductive malleable layer is at least plastically deformed by the conductive block under the applied pressure; and optionally
wherein the conductive malleable layer is at least plastically deformed at an elevated temperature between −50° C. and 150° C.; and/or
wherein the sub-assembly has a square or circular shape; and/or
wherein the conductive malleable layer is a flat diaphragm; and/or
wherein the conductive malleable layer is a continuous layer; and/or
wherein the thickness of the conductive malleable layer is from about 0.1 mm to 10 mm; and/or
wherein the conductive malleable layer comprises a material comprising copper, stainless steel, aluminium, silver, or an alloy of copper, aluminium, stainless steel and silver; and/or
wherein the conductive block comprises a material comprising copper, aluminium, silver, or an alloy of copper, aluminium, and silver.

6. The sub-assembly according to claim 1, wherein the stand-off plate comprises a material comprising copper, aluminium, silver, or an alloy of copper, aluminium, and silver.

7. The sub-assembly according to claim 1, wherein the conductive malleable layer and conductive blocks are formed using one piece of material.

8. The sub-assembly according to claim 1,
wherein the stand-off plate and conductive malleable layer are formed using one piece of material; or
wherein the stand-off plate, conductive malleable layer and conductive blocks are formed using one piece of material.

9. The sub-assembly according to claim 1,
wherein the sub-assembly is configured such that after the pressure is applied a conductive path is established through the semiconductor unit, conductive block, conductive malleable layer, and stand-off plate; and/or
further comprising a deflection limiting frame between the conductive malleable layer and semiconductor unit, and wherein the deflection limiting frame comprising polyether ether ketone (PEEK).

10. The sub-assembly according to claim 1, further comprising a semiconductor unit locator comprising a plurality of holes, wherein at least some of the plurality of semiconductor units are located in at least some holes of the semiconductor unit locator; and optionally wherein each semiconductor unit is located in each hole of the semiconductor unit locator.

11. The sub-assembly according to claim 10,
wherein the semiconductor unit locator comprises a plurality of ribs and the holes of the semiconductor unit locator are formed by the plurality of ribs; and optionally
wherein some semiconductor units are located in one hole and some other semiconductor units are located in another hole; and optionally
wherein the semiconductor units are arranged such that some semiconductor units have no ribs between two adjacent semiconductor units; or
wherein at least some of the ribs extend to a full width of the unit locator; or
wherein at least some of the ribs are located in a central region of the semiconductor unit locator.

12. The sub-assembly according to claim 10,
wherein at least some of the holes of the semiconductor unit locator have a square shape; and optionally
wherein the shape of the holes of the semiconductor unit locator controls the applied pressure distribution to each semiconductor unit so that the applied pressure is distributed substantially uniformly in a central region of the sub-assembly; and/or
wherein the semiconductor unit locator comprises a material comprising polyether ether ketone (PEEK).

13. The sub-assembly according to claim 10, further comprising a plurality of pressure means for applying pressure to the plurality of the semiconductor units, wherein the conductive malleable layer is located between the plurality of pressure means and the semiconductor unit locator.

14. The sub-assembly according to claim 13, wherein the pressure means comprises a spring.

15. The sub-assembly according to claim 14, further comprising a spring locator comprising a plurality of holes, wherein each pressure means is located in each hole of the spring locator; and optionally wherein the spring locator is operatively connected with the conductive malleable layer.

16. The sub-assembly according to claim 15, further comprising a first thrust pad and a second thrust pad within the holes of the spring locator on both sides of the pressure means, wherein the first thrust pad is protruded from a first surface of the spring locator and the second thrust pad is in contact with the conductive malleable layer; and optionally
wherein the first and second thrust pad each comprise a material comprising a metal; and/or
wherein the first and second thrust pad and the pressure means are integrated into a discrete component; and optionally
wherein the pressure means is selected such that a predetermined pressure is exerted using the spring locator, the pressure means, the first thrust pad and the second thrust pad; and optionally
wherein the predetermined pressure is applied to a threshold pressure limit so that the applied pressure compresses each pressure means to a degree that a lower most surface of the first thrust pad is in line with a lower most surface of the spring locator; and optionally
wherein the threshold pressure limit to each pressure means is about 1 Kilo Newton; and/or
wherein the applied pressure above the threshold pressure limit is supported by the spring locator and the semiconductor unit locator.

17. The sub-assembly according to claim 15,
wherein the spring locator and the semiconductor unit locator are connected to one another using a fixing means; and optionally
wherein the fixing means comprises non-conductive screws; and/or
wherein the sub-assembly is configured such that after the pressure is applied a first conductive path is established through the spring locator, conductive malleable layer, conductive block and the semiconductor unit; and/or
wherein the sub-assembly is configured such that after the pressure is applied a second conductive path is established through the first thrust pad, the pressure means, the second thrust pad, the conductive malleable layer, the conductive block and the semiconductor unit.

18. The sub-assembly according to claim 1, further comprising a printed circuit board on the conductive malleable layer, the printed circuit board is configured to distribute a control signal applied to a control terminal of the semiconductor unit; and optionally
wherein the printed circuit board comprises a plurality of holes, each hole being aligned with each hole of the stand-off plate; and optionally
wherein each conductive block is located in each hole of the printed circuit board.

19. The sub-assembly according to claim 1, wherein the semiconductor unit comprises:
a semiconductor chip;
a protection layer at the edge of the semiconductor chip;
a front side strain buffer;
a back side strain buffer;
a control terminal connection spring pin.

20. The sub-assembly according to claim 19,
wherein the back side strain buffer is a disc covering all the chips within the sub-assembly; and optionally
wherein the back side strain buffer comprises any one of aluminium-graphite, molybdenum and molybdenum-copper; and/or
further comprising a metal layer between the semiconductor chip and the front side and back side strain buffers; and/or
wherein the front side strain buffer and the back side strain buffer are attached to the semiconductor chip by a soldering technique; and/or
wherein the front side strain buffer and the back side strain buffer are attached to the semiconductor chip by a silver sintering technique.

21. A method for manufacturing a semiconductor device sub-assembly, the method comprising:
providing a plurality of semiconductor units laterally spaced to one another;
providing a plurality of conductive blocks operatively coupled with the plurality of semiconductor units;
providing a conductive malleable layer operatively coupled with the plurality of conductive blocks, wherein the plurality of conductive blocks are located between the conductive malleable layer and the plurality of semiconductor units, wherein, in use, at least some of the plurality of conductive blocks are configured to apply a pressure on the conductive malleable layer, when a predetermined pressure is applied to the semiconductor device sub-assembly; and
providing a stand-off plate operatively connected with an opposing surface of the conductive malleable layer compared to a surface of the conductive malleable layer to which the plurality of conductive blocks are coupled.

* * * * *